June 29, 1965 L. D. SKONNORD 3,192,306

COOLING WALL STRUCTURE FOR ELECTRONIC EQUIPMENT CABINET

Filed Sept. 26, 1962 6 Sheets-Sheet 1

INVENTOR
LELAND D. SKONNORD

BY Victor R Beckman
ATTORNEY

June 29, 1965 L. D. SKONNORD 3,192,306

COOLING WALL STRUCTURE FOR ELECTRONIC EQUIPMENT CABINET

Filed Sept. 26, 1962 6 Sheets-Sheet 2

INVENTOR
LELAND D. SKONNORD

BY Victor R. Beckman
ATTORNEY

June 29, 1965 L. D. SKONNORD 3,192,306

COOLING WALL STRUCTURE FOR ELECTRONIC EQUIPMENT CABINET

Filed Sept. 26, 1962 6 Sheets-Sheet 3

INVENTOR
LELAND D. SKONNORD

BY Victor R Beckman
ATTORNEY

COOLING WALL STRUCTURE FOR ELECTRONIC EQUIPMENT CABINET

Filed Sept. 26, 1962 6 Sheets-Sheet 4

INVENTOR
LELAND D. SKONNORD

BY Victor R. Beckman
ATTORNEY

June 29, 1965 L. D. SKONNORD 3,192,306

COOLING WALL STRUCTURE FOR ELECTRONIC EQUIPMENT CABINET

Filed Sept. 26, 1962 6 Sheets-Sheet 5

INVENTOR
LELAND D. SKONNORD

BY Victor R. Beckman
ATTORNEY

June 29, 1965 L. D. SKONNORD 3,192,306

COOLING WALL STRUCTURE FOR ELECTRONIC EQUIPMENT CABINET

Filed Sept. 26, 1962 6 Sheets-Sheet 6

INVENTOR
LELAND D SKONNORD

BY Victor R Beckman
ATTORNEY

United States Patent Office 3,192,306

Patented June 29, 1965

3,192,306

COOLING WALL STRUCTURE FOR ELECTRONIC EQUIPMENT CABINET

Leland D. Skonnord, Sunnyvale, Calif., assignor to Philco Corporation, Philadelphia, Pa., a corporation of Delaware Filed Sept. 26, 1962, Ser. No. 226,227
4 Claims. (Cl. 174—16)

This invention relates to an electrical equipment cabinet and more particularly to a novel wall structure for effecting the flow of cooling air within the cabinet.

Electrical equipment used in transmitters, receivers, computers and the like is generally mounted in cabinets or enclosures for safety, convenience and protection against dirt and damage. The electrical components are generally first mounted on chassis which are then mounted within the cabinets. When numerous heat producing components are included in the equipment, provision must be made for the removal of the heat generated by such components.

Prior art systems of cooling include the use of forced air which is passed over the components to be cooled. Such systems include the use of cooling ducts for carrying the air to and/or from the chassis mounted equipment. The cooling ducts may comprise an integral part of the cabinet or may be removably secured thereto. With either type prior art construction the equipment chassis must generally be removed from the cabinet to provide access to the ducts for formimng the necessary air openings therein. The equipment chassis must generally first be placed within the cabinet to determine where a flow of cooling air is desired for passage over the equipment, and the chassis must then be removed from the cabinet in order to provide access to the ducts for forming the necessary air openings therein. In some prior art arrangements the cooling ducts, when utilized, take up space which would ordinarily be occupied by components mounted in the cabinet. If cooling ducts are added to such a cabinet containing equipment, relocation of the components on the equipment chassis is often required to provide the necessary space for the ducts. Furthermore, the cooling ducts in prior art cabinets are generally adapted for use at only one location and in one position, thereby limiting the adaptability of the cabinets for use with different air source or exhaust means.

It is a primary object of this invention to avoid the above noted deficiencies of the prior art arrangements by providing a new and improved wall structure for equipment cabinets.

Another object of this invention is to provide equipment cabinet wall structure capable of cross ventilating electrical components of equipment mounted within the cabinet, such wall structure being supplied with novel air duct means capable of readily adapting the cabinet for use in various locations and with various air source or exhaust means without modification of the basic cabinet design.

These and other objects and advantages of the invention are achieved by means of an equipment cabinet in which a pair of generally vertical rectangular walls define opposite sides of the cabinet, each of these walls is formed with a vertical rectangular recessed portion which extends the entire height of the wall. Side wall panels constituting air ducts are removably secured within the vertical recessed portions of the side walls, and each panel or duct has a surface which overlies a rectangular vertically extended opening in the recessed portion of the associated wall. These surfaces have means effective to establish air flow communication between the ducts and the cabinet interior.

Two different configurations of side wall panels are adapted for mounting within the recesses of the side walls. In one configuration, the vertical dimension of the side wall pannel exceeds the cabinet height. In one mounting position of this side wall panel the panel extends above the top of the cabinet while in a second mounting position the panel extends below the bottom of the cabinet. The panel is open at the extended end thereof, whereby in the first mentioned mounting position the side wall panel is adapted for connection to an overhead air exhaust or supply arrangement (including a top-mounted blower arrangement) while in the latter mentioned position the duct may be employed with an underground or trench air supply or exhaust system. The same side wall panel may be used at either side of the cabinet and for use with either an overhead or underground cooling supply or exhaust system.

In the second, or modified, configuration of side wall panels the panels differ from those described above in that they are closed at both ends and extend for only the height of the equipment cabinet, and not above or below the cabinet. With such side wall panels closed at both ends the cabinet is adapted for use either with an internal blower or exhaust supply system or without any cooling system at all. These shorter side wall panels are also adapted for use on either side of the equipment cabinet. Further the side wall panels of either configuration are removable from outside of the cabinet whereby the cabinet contents do not have to be removed in order to install the ducts. Thus, when all of the chassis have been mounted within the cabinet and the determination as to where the cooling air stream is needed has been made, it is only necessary to remove the side wall panels from the cabinet and to form the necessary apertures therein for the passage of cooling air through the ducts. In addition, with the side wall panels in position on the sides of the equipment cabinet a plurality of cabinets may be secured together in a side by side arrangement without modification of the cabinet structure.

The invention will be better understood from the following description when taken with the accompanying drawings. In the drawings wherein like reference characters refer to like parts in the several views.

Figure 1:
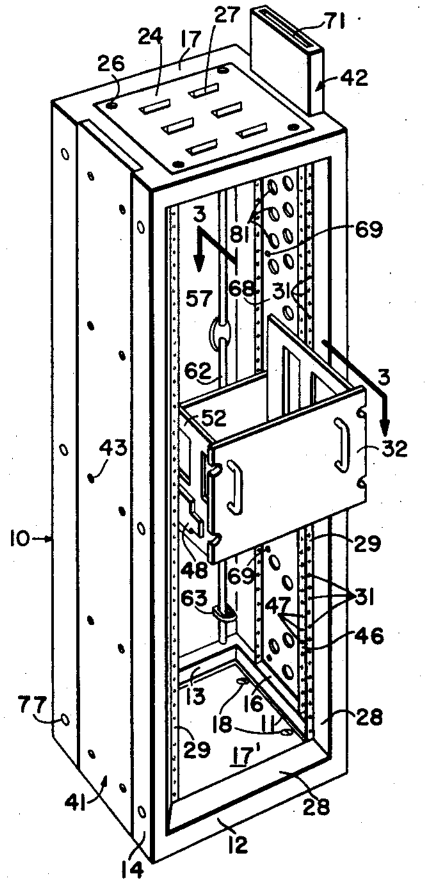
FIGURE 1 is a front perspective view of an equipment cabinet embodying this invention.
Figure 2:
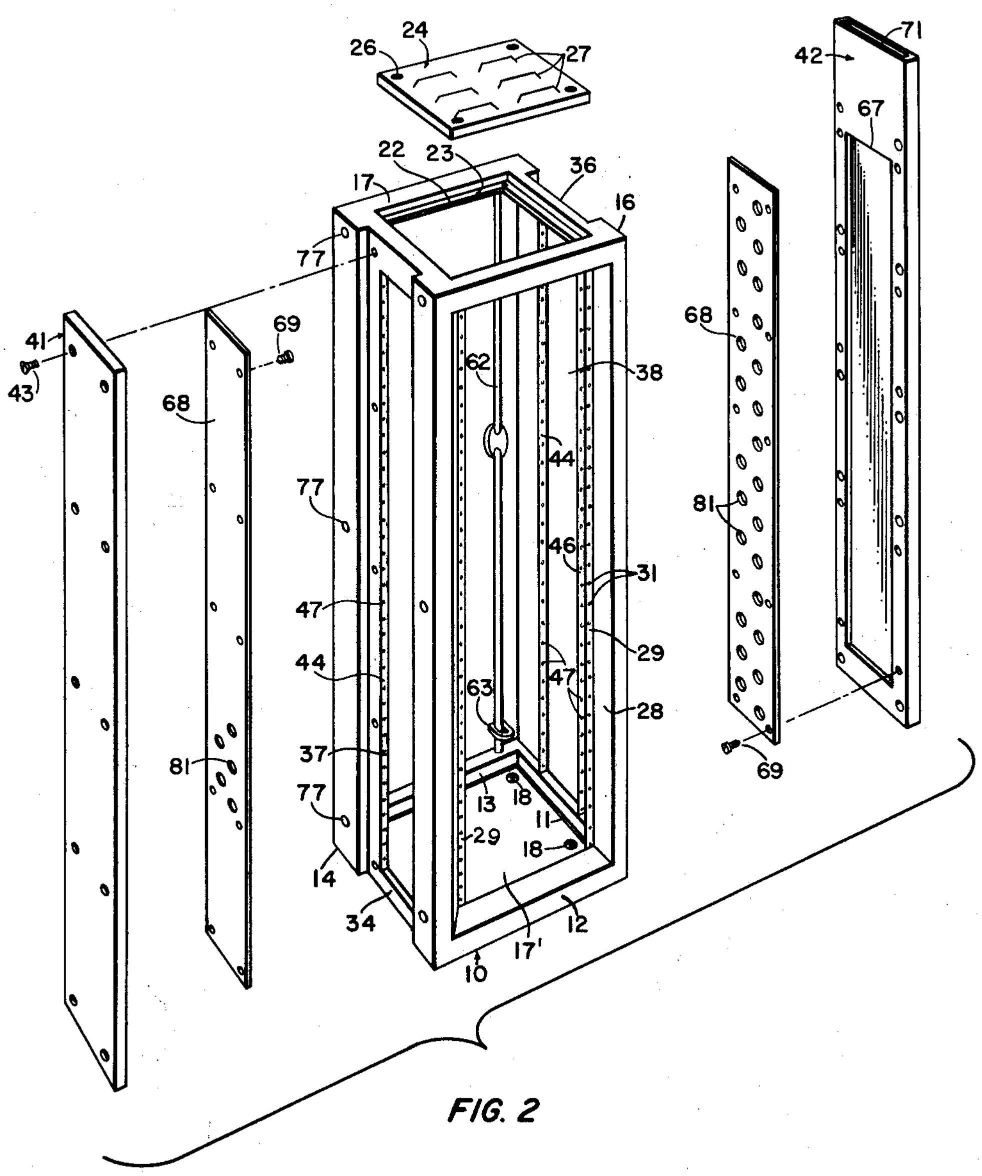
FIGURE 2 is an exploded perspective view of the cabinet shown in FIGURE 1.

Reference is first made to FIGURES 1 and 2 of the drawings wherein the novel equipment cabinet of this invention is shown designated generally by the reference numeral 10. The equipment cabinet comprises an open bottom member designated 11 from which extend vertically upward an open front member 12, an open rear wall 13, and open side walls 14 and 16. An open top 17 is provided at the top of the front member, rear, and side walls. The top 17, and bottom 11, front 12, and rear 13, and side walls 14 and 16 comprise preferably an integral unit made up of members welded or otherwise suitably secured together.

The bottom member 11 is closed by a bottom panel

17' suitably secured thereto as by means of screw fastening devices 18. Apertures, not shown, of various shapes and sizes may be formed in the bottom panel to accommodate electrical wires and cables. An opening 22 is formed in the top member 17 and a flange 23 is provided within the opening upon which a top panel 24 may seat. Screw fastening means 26 secure the top panel 24 to the flange 23. Louvers 27 are shown formed in the top panel 24 for the circulation of air therethrough.

The opening in the front member 12 is bounded by inwardly directed flanges 28 at the four sides thereof, and panel securing rails 29 are shown integrally formed on the vertical flanges 28. A series of apertures 31 are formed in the rails 29 through which suitable fastening means, not shown in FIGURES 1 and 2, may be passed for securing chassis panels to the cabinet, one chassis panel designated 32 being shown in FIGURE 1 of the drawings.

In accordance with this invention the open side walls 14 and 16 are provided with recesses extending the entire height of the cabinet, which recesses are designated 34 and 36 respectively. Apertures or openings 37 and 38 are formed in the recessed portion of the side walls 14 and 16 respectively, which apertures are adapted to be closed by either one of two types of side wall panels 41 and 42, the two different types or configurations of side wall panels being shown in FIGURES 1 and 2.

Figure 3:
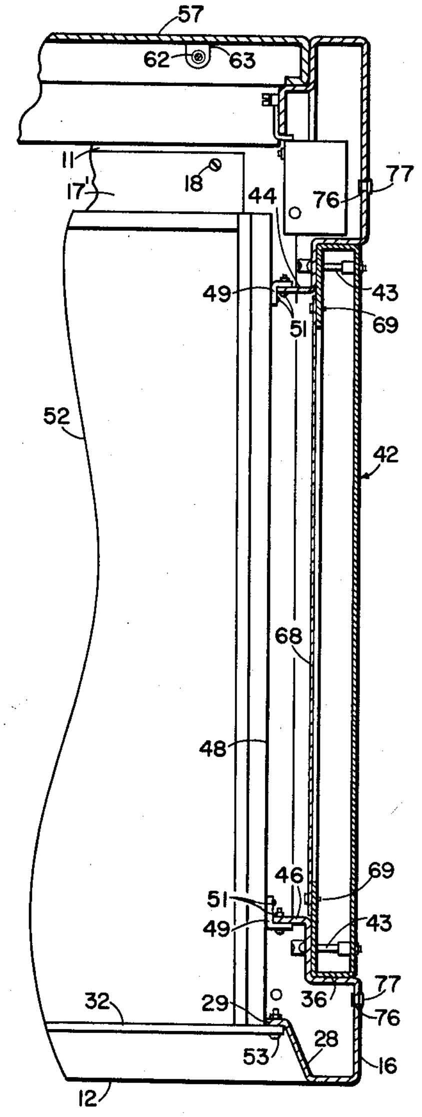
FIGURE 3 is a cross sectional view taken on line 3—3 of FIGURE 1.

Reference is now also made to FIGURE 3 of the drawings wherein it is seen that the vertical recesses formed in the side walls (only the one recess 36 being shown in FIGURE 3) have a depth substantially equal to the thickness of the side wall panels such that with the side wall panels in place on the cabinet the panels are substantially flush with the outside walls of the cabinet. Fastening means 43 extend through the panels 41 and 42 and into screw holes formed in the base of the recess for securing the side wall panels to the recessed side walls of the cabinet. The vertical walls defining the sides of the openings 37 and 38 in the side walls of the chassis terminate in inwardly directed chassis mounting rails designated 44 and 46. Spaced apertures 47 are formed in the chassis mounting rails 44 and 46 for support of chassis slide mounting devices 48 secured thereto as by angle brackets 49 and screw fastening devices 51. The slide mounts 48 are shown supporting a chassis 52 to which the front chassis panel 32 is secured. Screw fastening means 53 are shown securing the panel 32 to the chassis support rail 29 in FIGURE 3 of the drawings.

Figure 4:
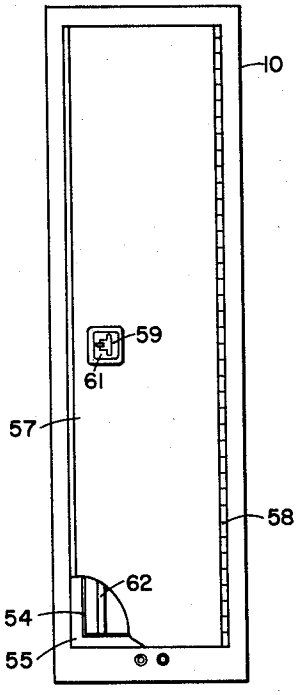
FIGURE 4 is a rear view of the equipment cabinet.

Referring now also to FIGURE 4 of the drawings the rear wall of the cabinet is shown formed with an opening 54 having a recessed inner edge portion 55. A door 57 is shown closing the opening 54 and abutting the recessed edge 55 in the closed position. The door may be secured to the cabinet as by means of a hinge 58, and is provided with a door handle 59 which is adapted to swing out from the recess 61 formed in the door. With the door handle 59 in an extended position it may be rotated for activation of door locking rods 62 operatively secured thereto. The door locking bars extend through guide members 63 (see FIGURES 2 and 3) suitably secured to the door and are adapted for engagement with holes formed in the flange extending about the door opening for locking the door in a closed position.

The side wall panels 41 and 42 comprise air ducts which are removably secured to the cabinet 10 from the outside thereof. As seen in FIGURE 2, the side wall panels are preferably formed with elongated apertures 67 which are adapted to be covered by vent covers 68 secured thereto as by screw fastening devices 69. The side wall panel 41 is closed at both the upper and lower ends thereof and has a length substantially equal to the height of the cabinet 10. It is adapted for mounting at either the left or the right side wall of the cabinet without alteration of any of the cabinet parts.

The side wall panel 42 is similar to the panel 41 except that the panel 42 has a greater vertical dimension and is open at one end 71. The other end of the panel 42 is closed. In FIGURE 1 of the drawings the side wall panel 42 is shown secured to the cabinet in a manner such that the panel extends above the top of the cabinet. The upwardly extended end of the duct 42 may be connected to a suitable external source of air supply or exhaust means and is adapted for mounting at either side of the cabinet. In addition, the side wall panel 42 may be mounted in a manner whereby the panel extends below the bottom of the cabinet rather than above the cabinet, such use being shown in FIGURE 6 of the drawings and described hereinbelow.

Figure 5:
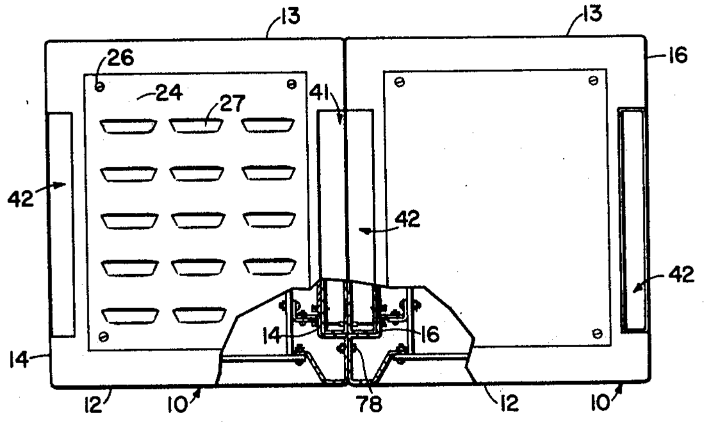
FIGURE 5 is a top view of two equipment cabinets joined together, with parts being shown broken away for clarity.

As seen in FIGURE 3 of the drawings, the side walls of the cabinets may be provided with apertures 76 which are normally closed by plug buttons 77. For side by side mounting of cabinets the plug buttons 77 are removed from the apertures 76 and the cabinets placed in a side by side position. Referring now to FIGURE 5 of the drawings screw fastening devices 78 are shown extending through the holes formed in the side walls of the cabinets for securing the cabinets together. Since the side wall panels 41 and 42 are substantially flush with the side walls of the cabinets, a side by side mounting of the cabinets is made possible without alteration of the cabinet. As seen in FIGURE 5 the cabinet at the right is provided with two side panels 42 whereas the cabinet at the left is provided with one side panel 41 and one side panel 42.

In the use of the cabinets the electrical components are mounted on the chassis 52 and although only one chassis is shown in FIGURE 1 of the drawings, it will be understood that a plurality of chassis are adapted for mounting with a single cabinet in the usual manner. After all of the electronic apparatus has been assembled on the chassis and tested, the chassis may be attached to the slide mounts 48 and mounted within the cabinet. With the equipment in place within the cabinet it may be ascertained where a supply of cooling air is required, i.e., the location where outlet holes should be formed in the vent cover 68 for efficient cooling is determined. The side wall panel 42 is then removed from the chassis by rotation of the locking devices 43. For ease in forming the necessary holes in the vent cover 68, the cover is removed from the side wall panel by loosening of the screw devices 69. With the vent cover removed from the side wall panel, holes 81 of suitable shape and size are formed in the vent cover at the desired locations. The vent cover is then secured to the side wall panel and the panel secured within the recess of the side wall. At no time is it necessary to remove the chassis from within the equipment cabinet to provide access to the ducts for forming the necessary air passageways therein.

Figure 6:
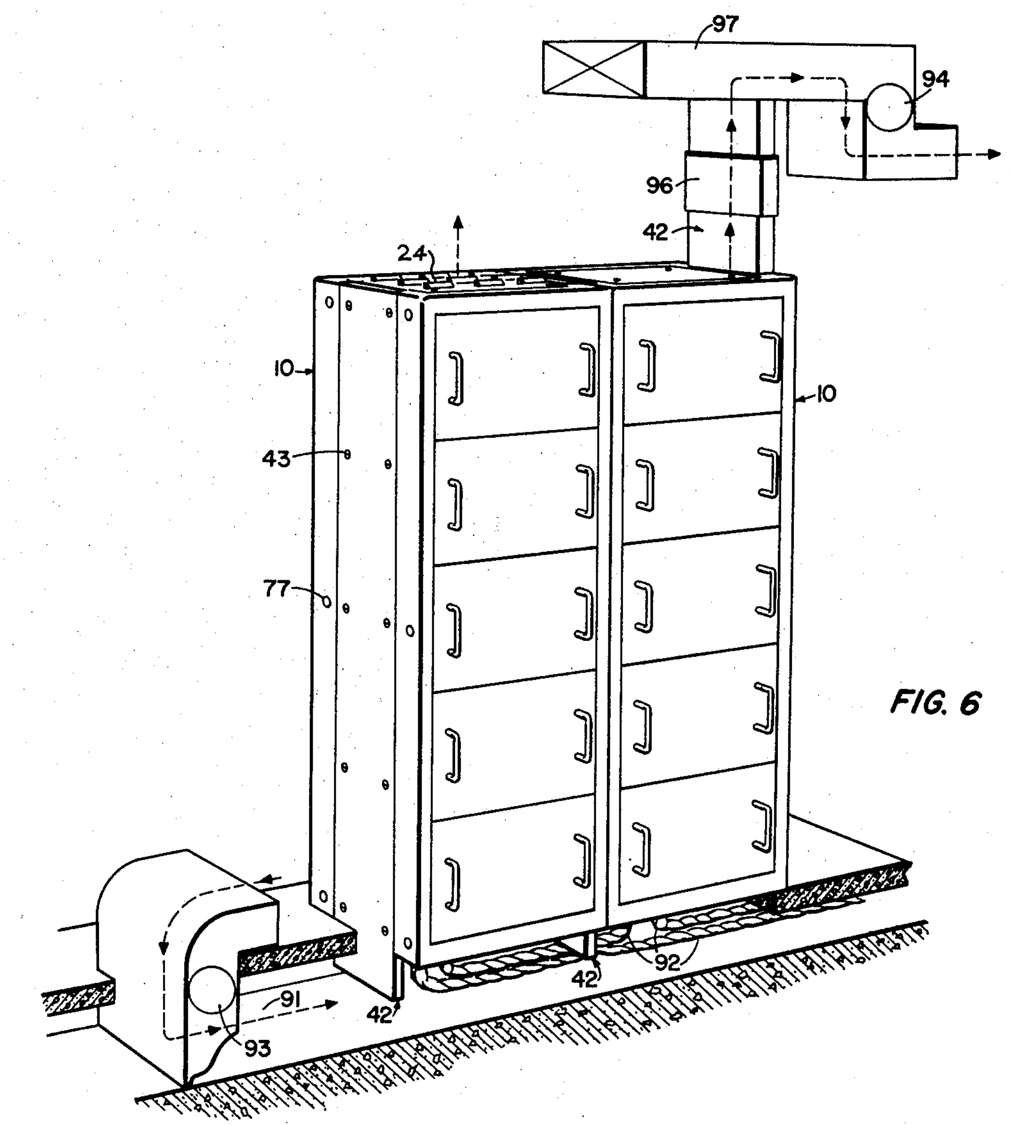
FIGURE 6 is a front perspective view of a pair of equipment cabinets joined together and showing an underground air supply and overhead exhaust system.

Not only is the novel equipment cabinet of this invention easy to use, but the cabinet is also extremely adaptable for use with different air sources. Reference is now made to FIGURE 6 of the drawings wherein there is shown, in a partial diagrammatic sketch, a pair of equipment cabinets 10 mounted in a side by side manner. The cabinets 10 are located over a floor trench 91 of conventional design which is commonly utilized for running of cables between equipment cabinets and outside equipment, such cables being designated 92 in the drawings. With the novel equipment cabinet of this invention, it is a simple matter to also utilize the floor trench as an air supply or exhaust chamber. This may be accomplished, for example, by the use of a blower 93 for supplying air to or exhausting air from the trench. Side wall panels 42 shown at the left of each of the equipment cabinets 10 extend downwardly into the trench and conduct air from the trench through the panels to the equipment mounted within the cabinets. The air which is supplied under pressure from the blower 93 to the cabinet at the left as viewed in FIGURE 6 escapes under pressure through the louvered top panel 24. The cabinet 10 as viewed at the right in FIGURE 6 is provided with an exhaust arrangement comprising a blower 94 connected to an upwardly extending side wall panel 42 by means of a flexible coupling 96 and chamber 97. As shown, the top panel member of the right hand cabinet 10 may be of a solid closed type without the louvers whereby all of the air from the cabinet at the right is drawn through the exhaust blower 94. It will be apparent that any combination of overhead and trench air supply and/or exhaust means may be employed without alteration of the basic design of the equipment cabinet of this invention.

Figure 7:
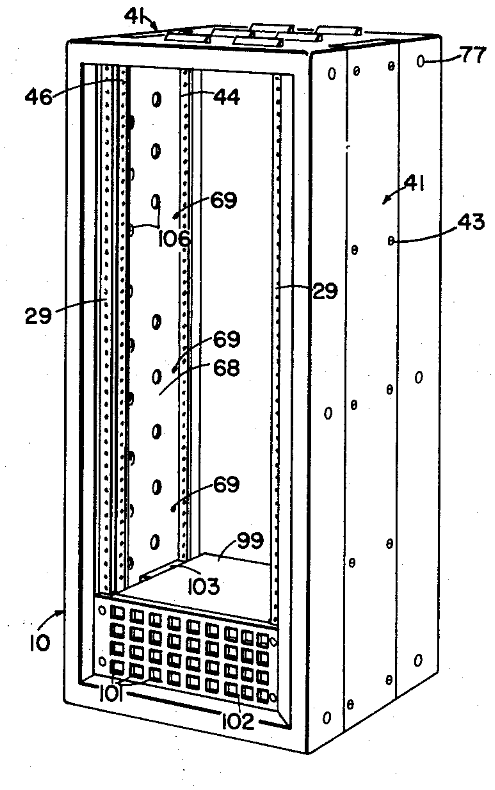
FIGURE 7 is a front perspective view of an equipment cabinet provided with a self-contained blower.

The equipment cabinet is also readily adapted for use with a self-contained air supply or blower system. Reference is now made to FIGURE 7 of the drawings wherein there is shown a cabinet 10 which is provided with side panel walls 41 at both sides of the cabinet. A panel type blower 99 is shown mounted within the cabinet at the bottom thereof, which blower is provided with intake openings 101 in the front panel 102 thereof. The blower outlet may be connected through a duct 103 to a side wall panel 41. A plurality of apertures 106 are shown in the vent cover 68 for the egress of air from the said side wall panel. Although no equipment other than the blower is shown mounted in the cabinet it will be understood that the electronic apparatus to be mounted in the cabinet is preferably mounted on chassis which are secured within the cabinet in the manner described above. Further, although the blower 99 is shown at the bottom of the cabinet, it will be apparent that any other location of the blower in the cabinet is possible, including the positioning thereof adjacent the top of the cabinet.

The invention having been described in detail in accordance with the requirements of the patent statutes, various changes and modifications will suggest themselves to those skilled in this art. It is intended that such changes and modifications shall fall within the scope and spirit of the invention as recited in the following claims.

I claim:

1. In a cabinet for housing electronic equipment, wall structure for effecting flow of cooling air within the cabinet comprising a pair of generally vertical rectangular walls defining opposite sides of the cabinet, each wall having an inwardly directed outwardly facing recessed portion extending the entire height of the wall and having a rectangular vertically elongated opening which occupies a major area of the wall, and a pair of generally vertical rectangular ducts, one duct being seated and removably secured within the recessed portion of one wall and having a surface element overlying the opening in said one wall, the other duct being removably secured within the recessed portion of the other wall and having a surface element overlying the opening in said other wall, both aforesaid surface elements having means establishing air flow communication between the ducts and the interior of the cabinet, at least one of said ducts being open at one end portion for connection with an air circulating system.

2. In a cabinet for housing electronic equipment, wall structure as set forth in claim 1, in which one of the mentioned ducts is closed at both of its end portions and is of a length substantially equal to the height of the recessed portion of the associated wall, and the other of the mentioned ducts is closed at one end portion and open at the other end portion, the latter end portion extending outwardly from the recessed portion of the associated wall for connection with an air circulating system.

3. In a cabinet for housing electronic equipment, wall structure as set forth in claim 1, in which one of the mentioned ducts is closed at both of its end portions and is of a height substantially equal to the height of the recessed portion of the associated wall, and the other of the mentioned ducts is closed at one end portion and open at the other end portion, the latter end portion extending upwardly from the upper extremity of the recessed portion of the associated wall for connection with an overhead type air circulating system.

4. In a cabinet for housing electronic equipment, wall structure as set forth in claim 1, in which one of the mentioned ducts is closed at both of its end portions and is of a length substantially equal to the height of the recessed portion of the associated wall, and the other of the mentioned ducts is closed at one end portion and open at the other end portion, the latter end portion extending downwardly from the lower extremity of the recessed portion of the associated wall for connection with a trench type air circulating system.

References Cited by the Examiner

UNITED STATES PATENTS

| | | | |
|---|---|---|---|
| 672,488 | 4/01 | Miller | 98—33 |
| 1,687,772 | 10/28 | Judelson | 312—257 X |
| 2,843,806 | 7/58 | O'Neill | 174—15 X |

FOREIGN PATENTS

| | | |
|---|---|---|
| 1,143,875 | 2/56 | France. |

OTHER REFERENCES

Western Devices Inc. (advertisement, copy received Mar. 2, 1959).

JOHN F. BURNS, *Primary Examiner.*

JOHN P. WILDMAN, *Examiner.*